United States Patent [19]

Kummer

[11] Patent Number: 4,841,286

[45] Date of Patent: Jun. 20, 1989

[54] APPARATUS AND METHOD FOR DETECTION OF AN OPEN THERMOCOUPLE IN A PROCESS CONTROL NETWORK

[75] Inventor: Karl T. Kummer, Doylestown, Pa.

[73] Assignee: Honeywell Inc., Minneapolis, Minn.

[21] Appl. No.: 153,753

[22] Filed: Feb. 8, 1988

[51] Int. Cl.⁴ .............................................. G08B 21/00
[52] U.S. Cl. ..................................... 340/653; 324/537
[58] Field of Search ............... 340/650, 651, 652, 653, 340/654; 324/537, 73 R; 374/179

[56] References Cited

U.S. PATENT DOCUMENTS 3,468,164  9/1969  Sutherland ...................... 324/537 X
3,590,370  6/1971  Fleischer ........................ 340/652 X
3,973,184  8/1976  Raber ................................. 340/650
4,571,689  2/1986  Hildebrand et al. ............ 340/652 X Primary Examiner—Joseph A. Orsino
Assistant Examiner—Jeffery A. Hofsass
Attorney, Agent, or Firm—William W. Holloway; Arthur A. Sapelli; Donald J. Lenkszus

[57] ABSTRACT

In a process control network, apparatus and method for periodic testing of a thermocouple element includes a switching mechanism that inserts a circuit with known parameters in series with the thermocouple. Voltages levels with and without the inserted circuit are compared and used to identify a failed or failing thermocouple.

13 Claims, 3 Drawing Sheets

4,841,286

APPARATUS AND METHOD FOR DETECTION OF AN OPEN THERMOCOUPLE IN A PROCESS CONTROL NETWORK

BACKGROUND OF THE INVENTION

1. Field of the Invention

This invention relates generally to networks that receive and transmit groups of logic signals from remote locations and, more particularly, to the verification of operation of the thermocouple elements located at remote sites in a control network.

2. Description of the Related Art

In the automatic control of processes, process control networks are provided to collect status information by at least one central location and to distribute control signals to the devices coupled to the network. Referring to FIG. 1, a portion of such a process control network is shown. The process control network includes a system bus 5 which has at least one central control unit 6 coupled thereto and at least one bus interface module 9 also coupled thereto. The central control unit 6 receives signals from the system bus 5 that typically communicate the status of user devices coupled to the process control network and applies signals to the network that provide the control signals determining the operation of the user devices. The bus interface module 9 applies status signals to the system bus and receives signals from the system bus 5 which are relevant to a subset of network user devices 10 that communicate with the central control unit 6 through bus interface module 9. User devices 10 capable of responding to digital signals, such as motors, lamps and heaters, receive control signals through device interface unit 16 and digital output module 12 from the bus interface unit 9. User devices 10 providing digital status signals in response to contact closures provide status signals to the bus interface module 9 by means of device interface unit 17 and digital input module 13. User devices 10 such as control valves, responding to analog control signals, receive signals from the bus interface module 9 through output analog module 14 and device interface unit 18. User devices 10 such as flowmeters, level detectors, pressure meters, temperature sensors, etc. of the type providing analog status information, provide the status signals to bus interface module 9 through device interface unit 19 and analog input module 15. The device interface units 16, 17, 18 and 19 convert the signals received from and transmitted to the user devices 10 into a format usable by the digital input and output modules and the analog input and output modules, respectively. The digital input and output modules 13 and 12 and the analog input and output modules 15 and 14 couple the signals of the user devices, as transformed by the device interface unit, with the bus interface module 9 by means of local bus 11.

The status information applied to the process control network has an accuracy limited by the accuracy of the sensor elements providing signals to a central control unit determined by environmental conditions. One of the important environmental factors in many processes is the temperature. The temperature is typically determined by a thermocouple element. Because of the critical nature of the temperature in the control of processes, failure of a thermocouple can compromise large amounts of processing activity prior to the identification of a failure. In the related art, a thermocouple has been tested by placing a voltage source and a large resistor in series with a thermocouple and checking for continuity. Using this technique, only catastrophic failures were detected and a thermocouple could provide erroneous reading prior to detectable failure.

A need has therefore been felt for apparatus and method that can operate continuously to identify the failure of a thermocouple to prevent the distribution of erroneous data.

FEATURES OF THE INVENTION

It is an object of the present invention to provide an improved process control network for transmission of status and control signals.

It is a feature of the present invention to provide a technique for the verification of a thermocouple.

It is another feature of the present invention to test periodically a thermocouple to determine when failure has occurred.

It is a more particular feature of the present invention to couple periodically a circuit in parallel with thermocouple and compare voltage levels with and without the inserted coupled circuit.

SUMMARY OF THE INVENTION

The aforementioned and other features are accomplished, according to the present invention, by testing apparatus that continuously monitors the parameters of a thermocouple. Periodically a known voltage source and series resistance are coupled in parallel with the thermocouple element and the associated lead resistance. A high impedance amplifier measures the voltage at an intermediate point in the circuit when the voltage source and series resistance are coupled to the thermocouple and the amplifier measures the voltage of the thermocouple when the voltage source and the series resistance are removed. The circuit components are chosen so that, in general, the voltage levels do not reach equilibrium during the periodic switching operation. By comparing voltage measurements at preselected times in the switching cycle, the parameters of the thermocouple can be monitored and a failing component identified.

These and other features of the present invention will be understood upon reading of the following description along with the drawings.

DESCRIPTION OF THE PREFERRED EMBODIMENT

1. Detailed Description of the Figures

Figure 1:
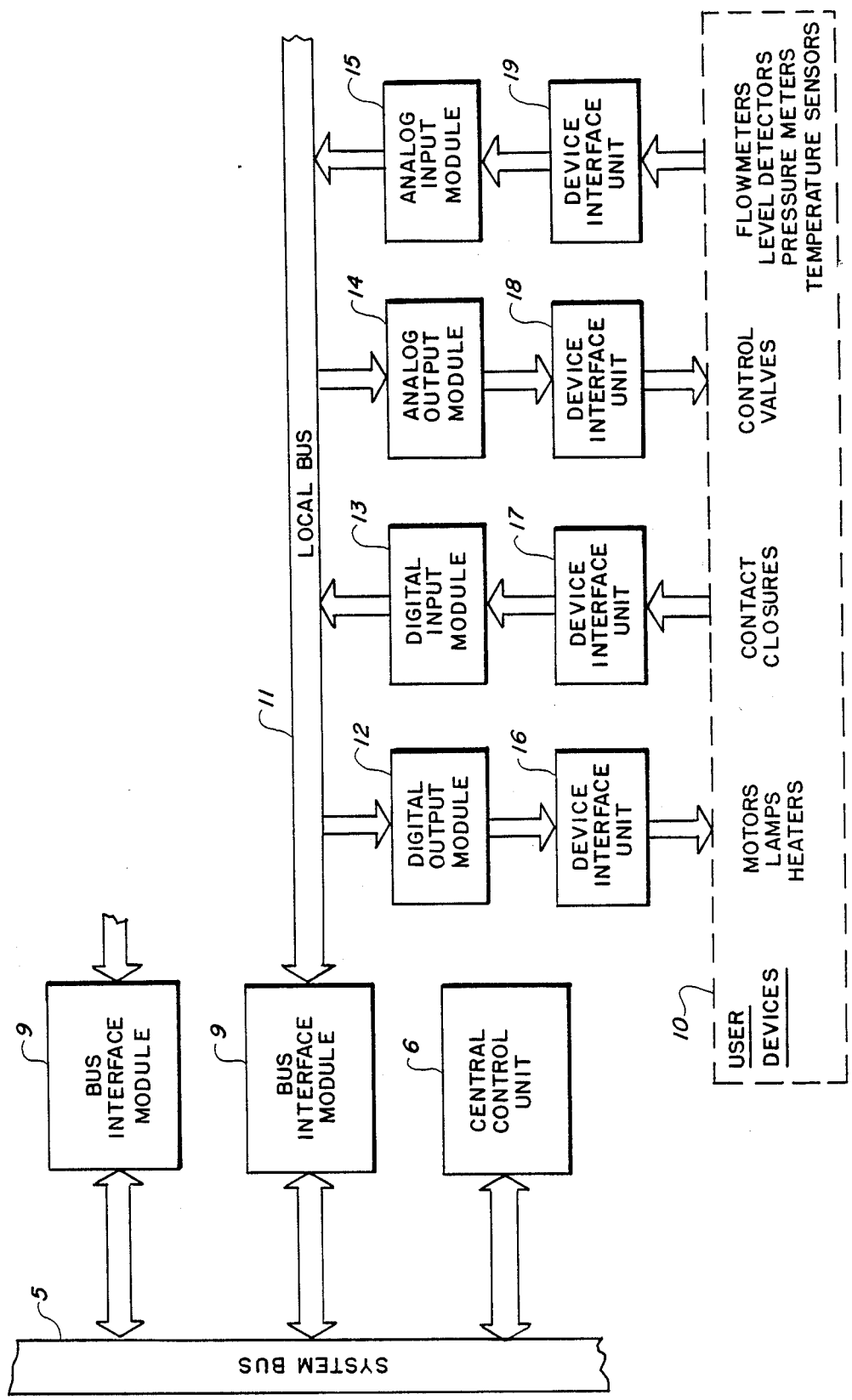
FIG. 1 is a block diagram of process control network capable of using the present invention.

FIG. 1 has been described with reference to the related art.

Figure 2:
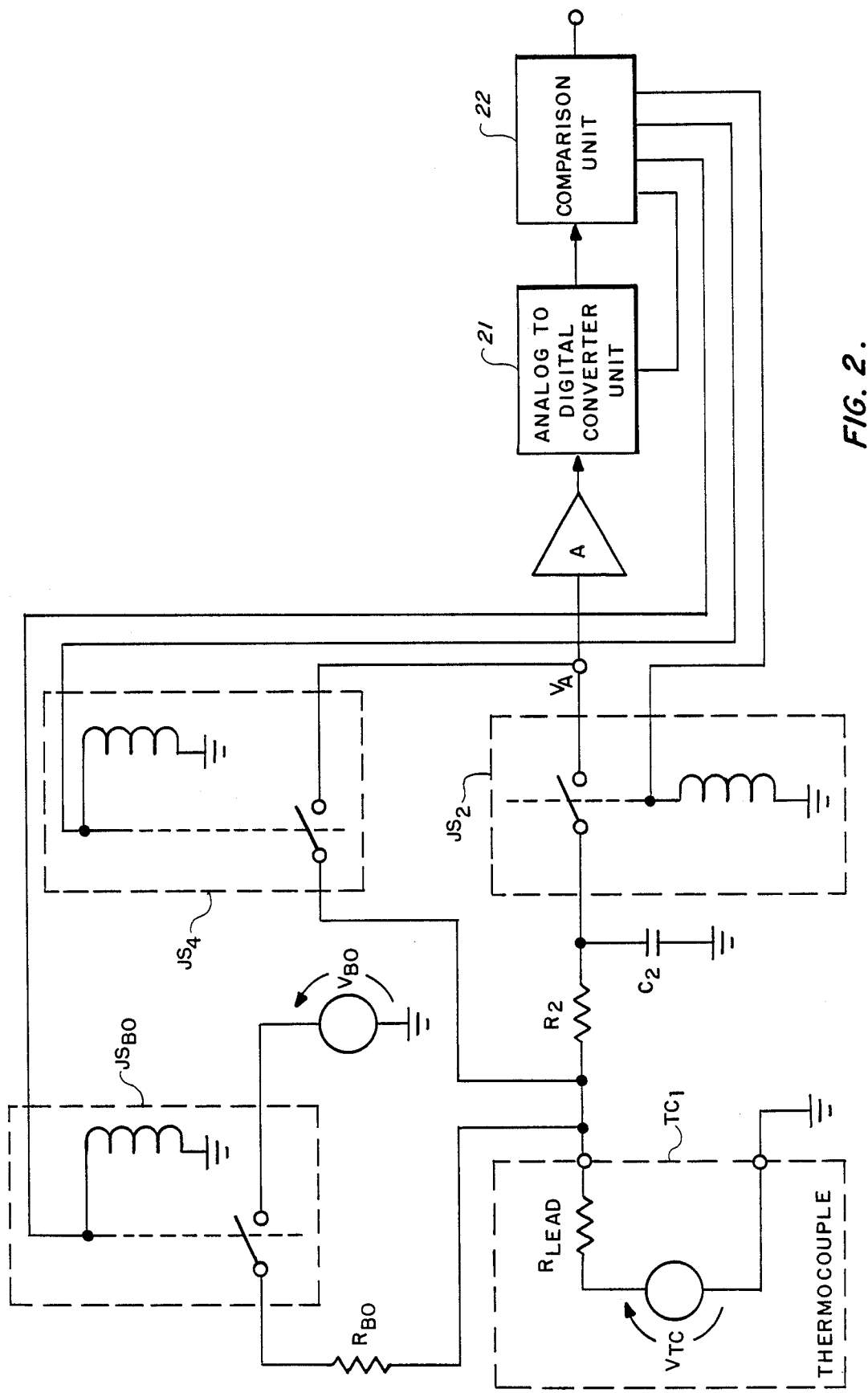
FIG. 2 is a circuit diagram of the components used in periodically testing a thermocouple according to the present invention.

Referring next to FIG. 2, a circuit diagram illustrates the components associated with a thermocouple that can be used to test periodically whether the thermocouple has failed. A thermocouple $TC_1$ is coupled between the common voltage terminal and a first terminal of resistor $R_{LEAD}$. A second terminal of $R_{LEAD}$ is coupled to a first terminal of resistor $R_{BO}$, to a first terminal of resistor $R_2$ and to a first terminal of switch $JS_4$. A second terminal of resistor $R_{BO}$ is coupled through switch $JS_{BO}$ to a first terminal of voltage source $V_{BO}$, a second terminal of voltage source $V_{BO}$ being coupled to the common potential. A second terminal of switch $JS_4$ is coupled to an input terminal of amplifier A. A second terminal of resistor $R_2$ is coupled through capacitor $C_2$ to the common potential and through switch $JS_2$ to the input terminal of amplifier A. The output terminal of amplifier A is coupled to an analog to digital converter unit 21 and the output of the analog to digital converter unit 21 is applied to comparison unit 22. Comparison unit 22 is also coupled to switches $JS_{BO}$, $JS_4$ and $JS_2$.

Figure 3:
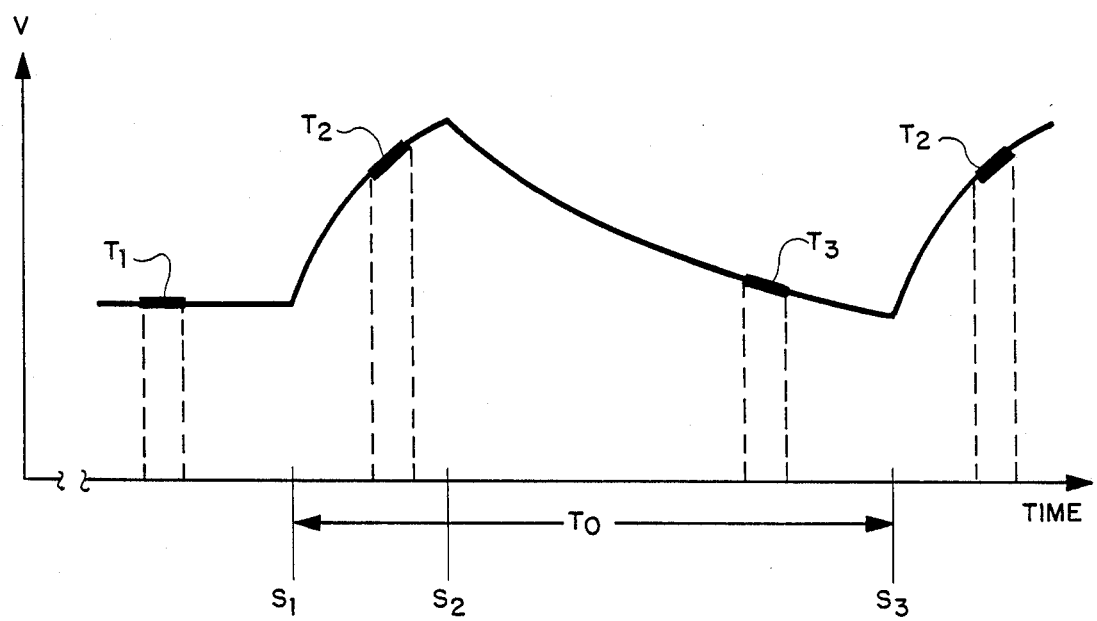
FIG. 3 illustrates the voltage applied to the input terminal of the amplifier A.

Referring next to FIG. 3A, the waveform of the voltage applied to amplifier A is shown. Prior to time $S_1$, an equilibrium value of the thermocouple 20 output voltage will be applied to amplifier A. At time $S_1$, the voltage source $V_{BO}$ and associated resistance $R_{BO}$ are coupled to the thermocouple 20 and the voltage applied to amplifier A will rise. At time $S_2$, the voltage source $V_{BO}$ and the series resistance will be removed from the circuit and the voltage applied to amplifier A will approach the equilibrium value established prior to time $S_1$. At time $S_3$, the switch states at time $S_1$ are replicated and the source voltage $V_{BO}$ and resistance $R_{BO}$ are coupled to the thermocouple.

2. Operation of the Preferred Embodiment

The operation of the testing apparatus can be understood by reference to FIG. 2. When switches $JS_{BO}$ and $JS_4$ are open and switch $JS_2$ is closed, the high input impedance amplifier, which is typically an analog to digital converter unit in an analog input module 15, measures the voltage generated by the thermocouple. When switches $JS_{BO}$ and $JS_4$ are closed and switch $JS_2$ is open, the amplifier A measures a voltage $$V_A = V_{IN} = V_{TC} + R_{LEAD} * (V_{TC} - V_{BO})/(R_{LEAD} + R_{BO}) \quad (1)$$

from which $R_{LEAD}$ can be determined, $R_{BO}$ and $V_{BO}$ being known and $V_A$ being a measured quantity. $V_{TC}$ is measured again with switches $JS_{BO}$ and $JS_4$ open and switch $JS_2$ closed. The magnitude of the disturbance caused by measuring the voltage involving both the thermocouple voltage and the reference voltage on the thermocouple can then be determined. This correction that is determined by the measurements is used to compensate for the disturbance of the thermocouple voltage before the quantity is used by the system.

Rather than measure an equilibrium parameter (voltage) value as described above, the preferred embodiment couples the source voltage $V_{BO}$ and series resistance $R_{BO}$ periodically and the voltage measurements are performed at preselected periods in the cycle. Referring once again to FIG. 3, the time interval $T_1$ illustrates a voltage level when switch $JS_{BO}$ and switch $JS_4$ are open and switch $JS_2$ is closed and sufficient time has elapsed for transient conditions to have ended. At time $S_1$, the switch positions are reversed and the voltage applied to amplifier A, $V_A = V_{IN}$, approaches the value given by equation 1. The time interval $T_2$ provides a measurement that is a function of the thermocouple parameters and the known circuit parameters. At time $S_2$, the switch states are reversed and the voltage applied to amplifier A approaches the equilibrium value measured during period $T_1$. At time $S_3$, the cycle started at time $S_1$ is repeated. The voltages determined intervals $T_1$, $T_2$ and $T_3$ are measured by an integrating type analog to digital converter (21). The integration takes place over preselected portions of the switching cycle represented symbolically by periods $T_2$ and $T_3$. Included in these measurements is an indicia of the quality of the thermocouple. For example, as the thermocouple resistance $R_{LEAD}$ increases or becomes an open circuit, the magnitude of the voltage measured during $T_2$ becomes larger. Also, the difference between the voltage measured during $T_2$ and $T_3$ will change, the charge on capacitor $C_2$ decaying slowly or being trapped thereon. The comparison of the voltage measured during $T_2$ and $T_3$ is performed in comparison unit 22 by techniques known in the prior art. Comparison unit 22 can also include the logic apparatus to determine an appropriate response to results of a comparison of the two voltage levels, i.e., a functioning thermocouple, a suspect or failing thermocouple and a failed thermocouple.

Because the temperature (measured by a thermocouple) can be crucial importance, the apparatus of the present invention is adapted to have a cycle that is 250 milliseconds in length. In this manner, a failed thermocouple can be identified before the process control network, operating in response to questionable data, can institute potentially disastrous responses. It will be clear that the switches $JS_{BO}$, $JS_4$ and $JS_2$ as well as the analog to digital converter 21 must be coordinated (or synchronized) to insure that measurements of the voltages during the intervals $T_2$ and $T_3$ occur at the preselected portions of the cycle. In the preferred embodiment, this coordination is accomplished by the comparison unit 22. Other coordination apparatus can be used with the same result. It will also be clear that amplifier A can be included as a part of the other apparatus, such as analog to digital converter 21.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. Apparatus for verifying operation of a thermocouple, said apparatus comprising:
   a voltage source having a known potential;
   a resistor having a known resistance;
   switch means for periodically inserting a voltage source and a resistor in series with said thermocouple;
   voltage means for measuring a first and a second voltage level at preselected times during a switch means cycle, said first voltage being measured when said voltage source and said resistor are coupled to said thermocouple, said second voltage level measured when said voltage source and said resistor are not coupled to said thermocouple; and
   comparison means for comparing said first and said second voltage level.

2. The apparatus for verifying operation of a thermocouple of claim 1 wherein said voltage means includes an integrating analog to digital converter unit.

3. The apparatus for verifying operation of a thermocouple of claim 1 wherein said voltage means includes a capacitor for filtering random noise and filtering changes resulting from said switching means.

4. The apparatus for verifying operation of thermocouple of claim 3 wherein operation of said switch means and said voltage means are synchronized by signals from said comparison means.

5. The method of verifying operation of a thermocouple, said method comprising the steps of:
   periodically inserting a circuit having known parameters in series with said thermocouple;
   measuring a first voltage level and a second voltage level at preselected times during a cycle determined by said circuit having parameters inserted periodically in series with said thermocouple; and
   measuring said first voltage level when said circuit having known parameters is coupled to said thermocouple; and
   measuring said second voltage level when said circuit having known parameters is not coupled to said thermocouple; and
   comparing a first voltage level measured at a first preselected time during said cycle with a second voltage level measured at a second preselected time.

6. The method of verifying operation of a thermocouple of claim 5 further comprising the step of including a voltage source in said circuit having known parameters.

7. The method of verifying operation of a thermocouple of claim 6 further comprising the step of selecting parameters of said circuit having known parameters and other circuit parameters wherein equilibrium voltage conditions are not obtained during said periodic coupling.

8. The method of verifying operation of a thermocouple of claim 7 further comprising the step of measuring said voltage levels by an analog to digital converter unit.

9. The method of verifying operation of a thermocouple of claim 8 further comprising the step of comparing said first and said second voltage levels, wherein said comparing step identifies failure or uncertain operation of said thermocouple.

10. The method of verifying operation of a thermocouple of claim 7 further comprising the step of coupling a capacitor to said thermocouple, said capacitor retarding transient voltage response to said coupling and uncoupling of said circuit having known parameters.

11. Apparatus for verifying operation of a thermocouple, said apparatus comprising:
    a test circuit including a known voltage source and a known resistance coupled in series;
    first switch means for coupling said test circuit to said thermocouple at a first node;
    amplifier means for providing an output signal related to a selected property of a signal applied to an input terminal;
    second switch means for coupling said first node to said input terminal of said amplifier means;
    a first resistance coupled to said first node;
    a capacitor coupled to said first resistor at a second node; and
    third switch means for coupling said second node to said amplifier means input terminal.

12. The apparatus for verifying operation of a thermocouple of claim 11 wherein said amplifier means includes an integrating analog to digital converter unit.

13. The apparatus for verifying operation of a thermocouple of claim 12 further comprising comparison means for comparing preselected signals from said amplifier means.

* * * * *